Jan. 20, 1970 J. E. THOMPSON 3,491,301

INTEGRATED HARMONIC MIXER CIRCUIT INCLUDING AN EMITTER COUPLED DIFFERENTIAL AMPLIFIER

Filed Oct. 29, 1965

INVENTOR
JAMES E. THOMPSON

BY

Mueller Aichele and Rauner

ATTYS.

United States Patent Office 3,491,301

Patented Jan. 20, 1970

3,491,301
INTEGRATED HARMONIC MIXER CIRCUIT INCLUDING AN EMITTER COUPLER DIFFERENTIAL AMPLIFIER

James E. Thompson, Scottsdale, Ariz., assignor to Motorola, Inc., Franklin Park, Ill., a corporation of Illinois Filed Oct. 29, 1965, Ser. No. 505,689
Int. Cl. H04b *1/28*
U.S. Cl. 325—451 11 Claims

ABSTRACT OF THE DISCLOSURE

A harmonic mixer including a differential amplifier connected to receive RF input signals and large signal local oscillations and for mixing these signals to obtain an output intermediate frequency signal having a frequency equal to twice that of the frequency of the local oscillations plus or minus the frequency of the RF input signals. The large signal local oscillations are combined with the RF input signal to overdrive the differential amplifier on a non-linear portion of its transfer characteristic and thereby produce harmonic mixing.

The present invention relates generally to frequency conversion circuits for mixing signals of different frequencies, and more particularly to an integrated semiconductor mixer circuit which functions in a non-linear mode as a harmonic mixer.

Although there has been a need for harmonic mixer circuits, such circuits which are suitable for commercial application have heretofore been unknown in the field of semiconductor electronics. The only semiconductor harmonic mixer circuit presently known includes a tunnel diode mixer which has objectionably low conversion gain.

Accordingly, it is an object of the present invention to provide a new mixer circuit which mixes effectively in the harmonic mode, and which has considerably higher conversion gain at certain predetermined input signal frequencies than the gain of any known prior art harmonic mixer circuit.

Another object of the invention is to provide a mixer circuit which simplifies local oscillator design and which has a good noise feature and high sensitivity.

Still another object of the invention is to provide a harmonic mixer which is particularly adaptable to integrated circuit design and which may be simply and easily constructed using conventional integrated circuit design techniques.

A feature of the invention is the provision of a frequency conversion circuit which will mix an incoming RF signal with a signal at twice the frequency of a local oscillator signal, thereby reducing the frequency response requirement of the semiconductor circuit design.

Another feature of the invention is the provision of a harmonic mixer circuit which is adapted to mix an incoming RF signal with a local oscillator signal, the maximum amplitude of which is substantially greater than that of the incoming signal.

Another feature of the invention is the provision of a pair of symmetrically coupled integrated transistors which are connected to form a harmonic mixer circuit having a transconductance which varies symmetrically about an input voltage of zero volts and which has a conversion transconductance which is a function of the amplitude of the local oscillator signal.

Another feature of the invention is the provision of first and second transistors symmetrically coupled in an integrated IF strip and local oscillator and RF receiver circuitry for applying local oscillation and an RF signal to either one transistor or respectively to both transistors for causing the RF signal to be mixed with the second harmonic of the local oscillator frequency.

The invention to be described is illustrated in the accompanying drawings wherein.

Briefly described, the invention includes first and second transistors symmetrically coupled at the input electrodes thereof and adapted to be connected to a source of RF input signals and a local oscillator for providing an intermediate frequency output signal as a result of harmonic mixing in the symmetrical transistor pair. The transconductance between the input and output of the symmetrical transistor configuration varies symmetrically about an input signal voltage of zero volts. When a local oscillator signal is applied to one of the transistors and the maximum amplitude of the local oscillator signal is substantially greater than the maximum amplitude of the RF input signal, an intermediate frequency output signal may be derived from the symmetrical transistor pair equal to twice the frequency of the local oscillator signal plus or minus the frequency of the input signal. Thus, the frequency and power requirements for the local oscillator are greatly reduced and the frequency response characteristics of the symmetrical transistor pair are enhanced by combining a signal at twice the local oscillator frequency with the RF input signal.

Figure 1:
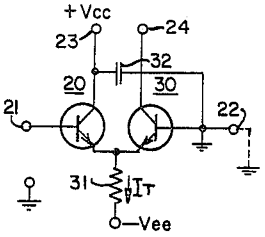
FIG. 1 illustrates the integrated semiconductor circuit of the invention to and from which the RF input, local oscillator, and output IF signals are coupled.

FIG. 1 shows the integrated transistor circuitry adapted to receive the RF input and local oscillator signals and to produce harmonic mixing therein. The symmetrically coupled transistors 20 and 30 are joined at the emitter electrodes thereof and are connected to a source of negative potential $-V_{ee}$ through resistor 31. A collector bias voltage $+V_{cc}$ is provided at terminal 23, and the transistors 20 and 30 are biased for class A operation. The output or collector electrode of transistor 20 is coupled to the base or control electrode of transistor 30 through a small RF decoupling capacitor 32, and the IF output signal current is taken from the collector circuit of transistor 30 by transformer coupling or any other suitable means.

Figure 2:
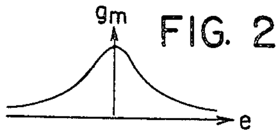
FIG. 2 is a graph of the small signal transconductance of the circuit of FIG. 1 as a function of input voltage $e$.

The circuit shown in FIG. 1 functions well in a non-linear mode as a harmonic mixer because its small signal transconductance is symmetrical for positive and negative values of the input voltage $e$ as shown in FIG. 2.

If the base or control electrode of transistor 20 in FIG. 1 is connected to both the input RF signal and the local oscillator signal, the instantaneous input voltage $e$ will be equal to $$e=E_o \cos \omega_o t+E_s \cos \omega_s t \qquad (1)$$

where the subscripts "$o$" and "$s$" refer to the local oscillator and input signals respectively. If, however, the maximum amplitude $E_o$ of the local oscillator signal is much greater than the maximum amplitude $E_s$ of the RF input signal ($E_o \gg E_s$), then the output current $i$ flowing in the collector circuit of transistor 30 will have signal components at frequencies $\omega_o$, $\omega_s$, $2\omega_o+\omega_s$ and $2\omega_o-\omega_s$. That is, the signal frequency is mixed with twice the local oscillator frequency.

LARGE OSCILLATOR SIGNAL ANALYSIS OF FIG. 1

In this section of the specification the characteristics of the circuit shown in FIG. 1 which are responsible for the harmonic mixing of $2\omega_o$ with plus or minus the signal frequency $\omega_s$ will be analyzed. In order to analyze the behavior of the symmetrical transistor pair mixer circuit in FIG. 1 for the large local oscillator signal condition, a non-linear model derived from the circuit of FIG. 1 is shown in a simplified form in FIG. 3 and will be related to the signal mixing in the harmonic mixer circuit.

Figure 3:
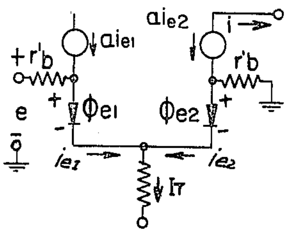
FIG. 3 is an equivalent circuit of FIG. 1.

The diodes in the circuit of FIG. 3 represent the non-linear relationship between base-emitter junction voltages ($\phi_{e1}$ and $\phi_{e2}$) and currents ($i_{e1}$ and $i_{e2}$) and this relationship may be expressed $$\phi_{e1}=\frac{kT}{q} \ln \frac{i_{e1}}{a_{11}} \qquad (2)$$

as $$\phi_{e2}=\frac{kT}{q} \ln \frac{i_{e2}}{a_{11}} \qquad (2A)$$

where: K=Boltzman's constant, T=temperature in degrees Kelvin, $q$=charge in Coulombs and $a_{11}$=a constant which depends on the transistor type used. The collector capacitances for the integrated transistor mixer circuit of FIG. 1 may be neglected in FIG. 3 for frequencies below 500 megacycles. In the non-linear model in FIG. 3, the instantaneous input voltage $e$ is related to the emitter current $i_{e1}$ of transistor 30 by the expression:

$$e=(1-\alpha)r_b'(2i_{e1}-I_T)+\frac{kT}{q} \ln \left(\frac{i_{e1}}{I_T-i_{e1}}\right) \qquad (3)$$

where $\alpha$ is equal to the individual current gain of transistor 20 and 30, $r_b'$ is equal to the individual base resistance of transistor 20 and 30 and $I_T$ is equal to the total emitter current of transistor 20 and 30. When the difference between current gain $\alpha$ and unity is negligible, Eq. 3 can be written as $$e \approx \frac{kT}{q} \ln \left(\frac{i_{e1}}{I_T-i_{e1}}\right) \qquad (4)$$

From this equation the expression for the transconductance $g_m$ can be derived and expressed as $$g_m=\frac{di}{de}=\frac{\alpha}{2(1-\alpha)r_b'+\frac{kT}{q}\frac{I_T}{i_{e1}(I_T-i_{e1})}} \qquad (5)$$

which, for reasons given above, may be approximated as $$g_m \approx \frac{\alpha_o}{\frac{kT}{q}\frac{I_T}{i_{e1}(I_T-i_{e1})}} \approx \frac{1}{\frac{kT}{q}\frac{I_T}{i_{e1}(I_T-i_{e1})}} \approx \frac{d_{ieI}}{de} \qquad (6)$$

where $\alpha_o$ is equal to the individual current gain of transistors 20 and 30 at low frequencies. The current gain $\alpha$ is approximately equal to 1 for frequencies much less than the alpha cutoff frequency $f\alpha$ of the transistors 20 and 30.

Figure 4:
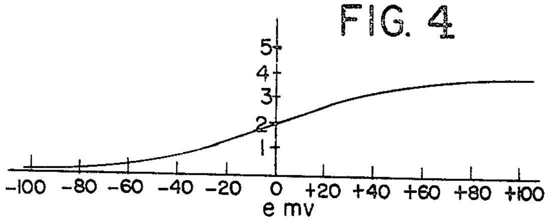
FIG. 4 is a graph illustrating the transfer characteristic of the circuit shown in FIG. 1 for a predetermined value of total current $I_T$ flowing therein.

By combining Eqs. 4 and 6 the small signal transconductance $g_m$ may be obtained as a function of the input voltage $e$. Since Eq. 4 is transcendental this is most easily done graphically. Eq. 3 is plotted in FIG. 4 for a total transistor emitter current $I_T$ equal to 4 milliamperes, and this value of current is compatible with bias supplies adapted to power the transistors 20 and 30 when formed in an integrated IF strip. Values of instantaneous input voltage $e$ for a given value of $i_{e1}$ may be taken from FIG. 4 and combined with Eq. 6 in order to obtain the plot of $g_m$ versus $e$ shown in FIG. 5. Since it is assumed that the maximum amplitude of the local oscillator voltage $E_o$ is much greater than that of the RF input signal, the tranconductance $g_m$ will be a function of time and may be expanded in a Fourier series as $$g_m(t)=g_{m0}+g_{m1} \cos \omega_o t+g_{m2} \cos 2\omega_o t+ \ldots \qquad (7)$$

Figure 6:
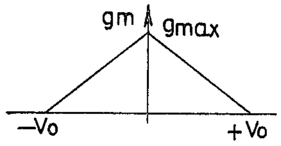
FIG. 6 is a triangular approximation of FIG. 5 which is to be used in obtaining values of $g_m$ when $E_o$, maximum value of the local oscillator signal, is greater than 100 millivolts.
Figure 5:
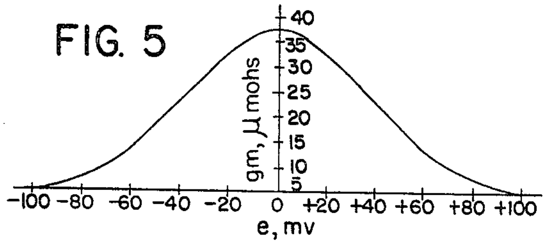
FIG. 5 is a plot of the transconductance $g_m$ versus input voltage $e$ for the circuit shown in FIG. 1.
Figure 9:
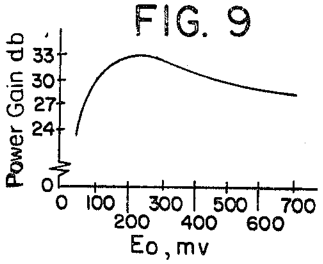
FIG. 9 is a graph of power gain versus local oscillator voltage amplitude for the circuit shown in FIG. 1 using a load resistance, $R_L$, equal to 20 kilohms.

For values of $E_o$ equal to or less than 100 millivolts, FIG. 5 may be analyzed graphically to determine the values of $g_{m0}$, $g_{m1}$, $g_{m2}$, and so on. For values of $E_o$ greater than 100 millivolts, however, the graphical technique using FIG. 5 is inaccurate, and the triangular approximation to the $g_m$ curve shown in FIG. 6 should be used. In FIG. 6 the values $+V_o$ represent values of $E_o$ greater than 100 millivolts.

Using standard Fourier techniques, the values of the maximum amplitude of the harmonics of the time varying transconductance $g_m(t)$ can be written as $$g_{mo}=\frac{g_{max}}{\pi} \sin \left(\frac{V_o}{E_o}\right) \qquad (8)$$

$$g_{m2k}=\frac{g_{max}}{2k^2\pi \text{ SIN}^{-1}\left(\frac{V_o}{E_o}\right)}\left[1-\text{COS}\left\{2K \text{ SIN}^{-1}\left(\frac{V_o}{E_o}\right)\right\}\right], k\neq 0 \qquad (9)$$

and $$g_{m1}=g_{m3}=g_{m5}=\ldots=0 \qquad (10)$$

Since the values of $g_{m1}$, $g_{m3}$ and $g_{m5}$ for the odd multiples of $\omega_o$ are equal to 0 for the particular curvature of the $g_m$ function in FIG. 5, the time varying transconductance $g_m(t)$ may be expressed as $$g_m(t)=g_{m0}+\sum_{k=1}^{\infty} g_{m2k} \cos 2k\omega_o t \qquad (11)$$

Thus, Eq. 11 expresses the fact that the application of a large signal local oscillator voltage of frequency $\omega_o$ at the input of transistor 20 creates a time varying transconductance with frequency components only at even multiples of $\omega_o$ causing harmonic mixing to occur.

Figures 7, 11:
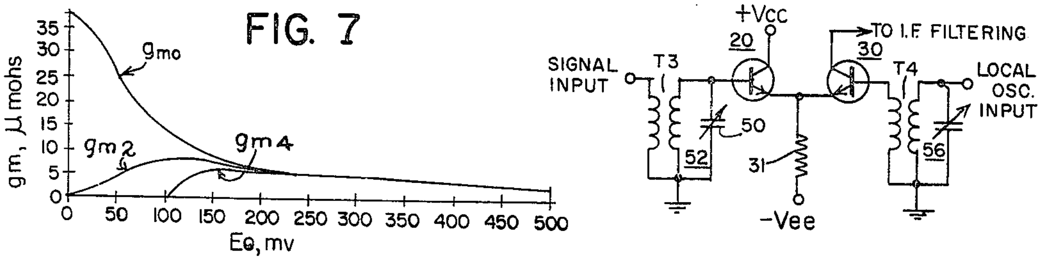
FIG. 7 is a graph of the conversion transconductance (the ratio of output current at the IF frequency to the input voltage at the signal frequency) as a function of local oscillator voltage amplitude.
FIG. 11 is an emitter coupled transistor pair harmonic mixer showing the local oscillator and input voltages applied to identical electrodes of the two transistors respectively.

FIG. 7 is a graph illustrating the dependance of $g_{m0}$, $g_{m2}$ and $g_{m4}$ as a function of local oscillator voltage $E_o$.

If the signal $E_s \cos \omega_s t$ is applied to the input of transistor 20, the output current for transistor 30 will be $$i(t)=g_m(t)E_s \cos \omega_s t \qquad (12)$$

Combining Eqs. 11 and 12 where $E_o \gg E_s$, the output current $i(t)$ can be represented as $$i(t)=g_{m0}E_s \cos \omega_s t+g_{m2}E_s \cos 2\omega_o t \cos \omega_s t +g_{m4}E_s \cos 4\omega_o t \cos \omega_s t+\ldots \qquad (13)$$

or $$i(t)=g_{m0}E_s \cos \omega_s t +\frac{g_{m2}E_s}{2}[\cos (2\omega_o+\omega_s)t+\cos (2\omega_o-\omega_s)t] +\frac{g_{m4}E_s}{2}[\cos (4\omega_o+\omega_s)t+\cos (4\omega_o-\omega_s)t] +\ldots \qquad (14)$$

Therefore, if a tuned circuit is coupled to the output of the integrated semiconductor mixer circuit of FIG. 1 to eliminate all frequency components with the exception of the desired intermediate frequency $\omega_{IF}$ which is equal to $2\omega_o-\omega_s$, the output current $i_t$ at the intermediate frequency may be expressed as $$i(t)=\frac{g_{m2}E_s}{2}\cos(2\omega_o-\omega_s)t \qquad (15)$$

or $$i(t)=\frac{g_{m2}E_s}{2}\cos\omega_{IF}t \qquad (16)$$

Eqs. 15 and 16 express the fact that the conversion transconductance (ratio of output current at the IF frequency to the input voltage at the signal frequency) $g_{mc}$ is equal to $g_{m2}/2$. Thus, the conversion transconductance $g_{mc}$ is also a function of the local oscillator signal amplitude $E_o$, and the $g_{m2}$ curve in FIG. 7 shows that the conversion transconductance $g_{mc}$ peaks at approximately 125 millivolts.

CONVERSION GAIN

Figure 8:
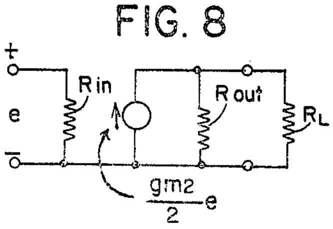
FIG. 8 is an equivalent circuit for the harmonic mixer circuit of FIG. 1 with the reactances therein tuned out.

Using the IF conversion transconductance of Eq. 16 which is $g_{m2}/2$, the mixer circuit of FIG. 1 may be represented by the circuit of FIG. 8 assuming the reactances of the mixer circuit are tuned out. For the circuit of FIG. 8 the conversion power gain P.G. is defined by the expression $$\text{P.G.}=\left(\frac{g_{m2}}{2}\right)^2 R_L R_{in}\left(\frac{R_{out}}{R_{out}+R_L}\right)^2 \qquad (17)$$

where $R_L$ is the load resistor connected to the mixer output and $R_{in}$ and $R_{out}$ are input and output resistances at which optimum power gain occurs.

Figure 10:
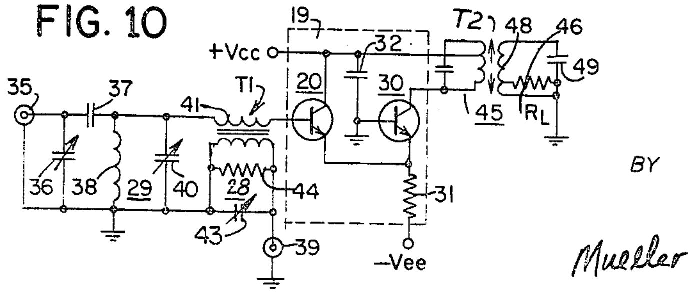
FIG. 10 is the complete mixer circuit of the invention with the integrated transistor circuitry enclosed by the dotted lines.

By relating the values of $g_{m2}$ in FIG. 7 to the local oscillator voltage $E_o$ a graph of power gain versus local oscillator voltage may be obtained, and for the particular table of values and conditions for the circuit of FIG. 10, a maximum power gain of approximately 33 db occurs with a local oscillator voltage $E_o$ equal to 200 volts.

FIG. 10 illustrates a complete mixer circuit including the integrated transistor circuit 19 shown in FIG. 1. The circuit of FIG. 10 converts 120 megacycles into a 10.7 megacycle IF output and utilizes a pi matching network to match an input resistance of 12 kilohms with a 50 ohm impedance at the 120 megacycle signal source. The pi matching network 29 consisting of inductor 38 and capacitor 40 is connected to transformer winding 41 in the base circuit of the input transistor 20 and is coupled through capacitor 37 to the input signal source 35. A tuning capacitor 36 is connected between the RF signal source 35 and ground. A local oscillator 39 having a frequency of approximately 65.35 megacycles is transformer coupled at T1 to the base of input transistor 20, and a capacitor 43 connected in parallel with an input transformer winding 21 is provided for tuning the RLC tank circuit 28 at the output of the local oscillator 39. The toroidal transformer T1 permits injection of the local oscillator voltage in series with the RF signal voltage.

The IF transformer T2 presents a load of approximately 20 kilohms to the output of the LC tank 45, but this load may be varied by changing the position of the tap on transformer winding 48 at which resistor 47 is connected.

The following is a table of conditions and component values for the circuit shown in FIG. 10. However, these values should not be construed as limiting the scope of the invention.

TABLE

| | |
|---|---|
| Transistors **20, 30** | NPN. |
| Intput signal frequency | 120 megacycles. |
| Local oscillator signal frequency | 65.35 megacycles. |
| Signal source output resistance | 50 ohms. |
| Capacitors: | |
| **36** | 9–35 picofarads. |
| **37** | 5 picofarads. |
| Inductance **38** | 0.1 microhenry. |
| Variable capacitor **40** | 9–35 picofarads. |
| Transformer T1 | Micrometals T12–10 core. 2–7T No. 32 windings. |
| Variable capacitor **43** | 9–45 picofarads. |
| Resistor **44** | 50 ohms. |
| Integrated semiconductor emitter coupled transistor pair **20, 30.** | Motorola MC–1110. |
| Transformer T2 | Miller No. 1601. |
| Supply voltages: | |
| $+V_{cc}$ | +5 volts. |
| $-V_{ee}$ | −5 volts. |
| Load resistor RL | 1.2 kilohms. |

FIG. 11 illustrates a slightly different embodiment of the invention wherein the RF input signal voltage and the local oscillator voltage are transformer coupled at T3 and T4 to the respective bases of the input and output transistors 20 and 30. The harmonic mixing of the local oscillator signal with the RF input signal when the former is injected into the base of transistor 30 is no different from the mixing which occurs in the embodiment of FIG. 10, and the transistors 20 and 30 are biased in the same manner as they are in FIG. 10. Both the input circuits for the transistors 20 and 30 include a variable impedance LC tank circuit 52, 56 for receiving input and oscillator signals respectively.

Thus, the mixer circuit according to the teachings of the present invention requires a local oscillator operating at only one-half the desired mixing frequency, and this feature reduces substantially the power consumption and radiation through the preceding RF stages. The mixer circuit exhibits a high gain and a low noise figure when converting 120 megacycles to 10.7 megacycles and greatly simplifies local oscillator design.

I claim:

1. A harmonic mixer including in combination:
(a) means for receiving an input signal,
(b) frequency conversion means connected to said receiving means,
(c) means for providing large signal local oscillations connected to said frequency conversion means for applying said large signal local oscillations as an integral part of said input signal and for overdriving said frequency conversion means and providing a time varying transconductance, said frequency conversion means mixing said input signal with a signal having a frequency equal to twice that of said large signal local oscillations, and
(d) said frequency conversion means having a transconductance which varies symmetrically about an input signal voltage of zero volts.

2. A mixer according to claim 1 wherein:
(a) said frequency conversion means includes a first semiconductor device for receiving said input signal,
(b) a second semiconductor device connected to said first semiconductor device for providing a path for the local oscillations and input signals, and
(c) means for deriving an intermediate frequency signal from said second semiconductor device, said IF signal having a frequency equal to twice the frequency of said local oscillations plus or minus the frequency of the input signal.

3. The mixer according to claim 2 wherein:

(a) said first and second semiconductor devices have input, output and control electrodes, (b) said input electrodes are connected together and form a common junction about which said semiconductor devices are symmetrical, and (c) said mixer further including means for coupling said local oscillations to one of said semiconductor devices, said local oscillations having a maximum value substantially greater than that of said input signal.

4. The mixer according to claim 3 wherein:

(a) said semiconductor devices are transistors which are symmetrically coupled in a common emitter connection, and (b) said mixer further includes means connecting said transistors to a voltage supply for biasing said transistors into conduction.

5. A harmonic mixer circuit including in combination:

(a) a first transistor having input, output and control electrodes, said first transistor connected for receiving RF input signals to be mixed with a local oscillator signal, (b) a second transistor having input, output and control electrodes, said input electrode of said second transistor being connected to said input electrode of said first transistor at a common junction about which said first and second transistors are symmetrical, (c) means connecting said transistors to a supply voltage for biasing said transistors into conduction, (d) means coupled to one of said transistors for applying large signal local oscillations as an integral part of said input signals for overdriving said first and second symmetrically coupled transistors and providing a time varying transconductance, and (e) output circuit means coupled to one of said transistors for deriving an IF signal therefrom having a frequency equal to twice the frequency of said local oscillator signal plus or minus the frequency of said input signals.

6. The mixer according to claim 5 wherein the transconductance between the control electrode of said first transistor and the output electrode of said second transistor varies symmetrically about an input signal voltage of zero volts.

7. The mixer according to claim 6 wherein said means for applying large signal local oscillations includes a local oscillator connected to one of said first and second transistors and generating an output signal with a maximum value which is substantially greater than that of said input signals.

8. The mixer according to claim 7 wherein:

(a) said control electrode of said first transistor is connected to receive said RF input signals, and (b) said output circuit means is connected to the output electrode of said second transistor.

9. The mixer according to claim 8 wherein said control electrode of said second transistor is connected to said local oscillator.

10. The mixer according to claim 8 wherein said local oscillator is transformer coupled to the control electrode of said first transistor.

11. The mixer according to claim 10 wherein:

(a) said local oscillator has a frequency of approximately one-half that of the incoming input signal, and (b) said output circuit means includes means for transformer coupling the IF signal at the output electrode of said second transistor, said output circuit means being tuned to a frequency equal to that of twice the frequency of the local oscillator plus or minus the frequency of the incoming signal.

References Cited

UNITED STATES PATENTS

| | | | |
|---|---|---|---|
| 3,107,331 | 10/1963 | Barditch et al. | 325—442 XR |
| 3,302,118 | 1/1967 | Schoen | 325—451 |

ROBERT L. GRIFFIN, Primary Examiner

R. S. BELL, Assistant Examiner

U.S. Cl. X.R.

325—438